United States Patent [19]
Murai et al.

[11] Patent Number: 5,256,454
[45] Date of Patent: Oct. 26, 1993

[54] METHOD FOR SUPPRESSION OF ELECTRIFICATION

[75] Inventors: Fumio Murai, Tokyo; Yasunori Suzuki, Hachioji; Hideki Tomozawa, Tokyo; Ryuma Takashi, Tokyo; Yoshihiro Saida, Tokyo; Yoshiaki Ikenoue, Tokyo, all of Japan

[73] Assignees: Hitachi, Ltd.; Showa Denko K.K. Corporations, both of Tokyo, Japan

[21] Appl. No.: 707,819

[22] Filed: May 30, 1991

[30] Foreign Application Priority Data

May 30, 1990 [JP] Japan .................. 2-138467

[51] Int. Cl.$^5$ .............................. B05D 3/06
[52] U.S. Cl. .................. 427/498; 427/258; 427/279; 427/404; 427/407.1; 427/419.2; 427/419.6; 427/496; 427/504; 427/506; 427/525; 427/526; 427/552
[58] Field of Search .............. 427/44, 43.1, 35, 404, 427/407.1, 258, 279, 419.6, 419.2, 496, 498, 504, 506, 525, 526, 552

[56] References Cited
PUBLICATIONS

Patent Abstracts of Japan, vol. 7, No. 220 (P-226)(1365) Sep. 30, 1983 & JP-A-58 113 925 (Fujitsu Ltd) Jul. 7, 1983.
World Patents Index Latest, Week 8940, Derwent Publication Ltd. London GB; AN 89-288954, & JP-A-1 211 918 (Fujitsu Ltd) Aug. 25, 1989.
Patent Abstract of Japan, vol. 13, No. 68 (E-716) Feb. 16, 1989 & JP-A-63 254 729 (Matsushita Electronics Corp.) Oct. 21, 1988.
World Patents Index Latest, Week 8840, Derwent Publication Ltd., London, GB AN 88-281025 & JP-A-63 204 724 (Matsushita Eltrn Corp) Aug. 24, 1988.
Patent Abstracts of Japan, vol. 12, No. 252 (C-512) Jul. 15, 1988 & JP-A-63 039 916 (Showa Denko KK) Feb. 20, 1988.

Primary Examiner—Bernard Pianalto
Attorney, Agent, or Firm—Antonelli, Terry, Stout & Kraus

[57] ABSTRACT

Electrification is suppressed with a water-soluble electrification-suppressing film having an electron conductivity and comprising a polymer resin. A high electrification-suppressing effect which is also high in vacuum can be easily obtained by using the electrification-suppressing film with less contamination.

19 Claims, 6 Drawing Sheets

METHOD FOR SUPPRESSION OF ELECTRIFICATION

BACKGROUND OF THE INVENTION

The present invention relates to a method for suppression of electrification and in particular to a method for suppression of electrification in electron beam writing, observation, and linewidth measurement using charged particle-beams such as an electron beam, etc. and also in ion implantation.

In pattern formation using charged particle-beams such as an electron beam, an ion beam, etc. especially when an insulating substrate is used, the substrate is electrified and the orbit of incident charged particle-beam is deflected by the electric field formed by charges in the substrate. Thus, there is a problem of inaccurate positioning of patterns to be formed.

Furthermore, in observation instruments using charged particle beams such as an electron beam microscope and an electron beam linewidth measurement system, distortion of observed image or inaccurate linewidth measurement occurs owing to the substrate electrification phenomenon. Moreover, in the ion implantation technique used for introducing impurities into a semiconductor substrate, dielectric breakdown of an oxide film deposited on the substrate sometimes occurs due to the electrification phenomenon, when the ion implantation is carried out at a high concentration, resulting in a failure in breakdown voltage of gate electrodes in MOS field effect transistors.

Hitherto, many methods for reducing the electrification of substrates in the electron beam writing are known. For example, the electrification effect can be eliminated most simply by deposition of a thin metal film by evaporation onto the substrate destined for the writing prior to the electron beam writing.

Furthermore, it is known to form a chloromethylpolystyrene layer as an underlayer on an electron beam resist [Japanese Patent Application Kokai (Laid-Open) No. 63-129622]. Since the chloromethylpolystyrene turns electroconductive when irradiated with an electron beam, the injected electrons migrate to the conducting substrate without electrification of the underlayer.

Japanese Patent Application Kokai (Laid-Open) No. 1-132122 discloses a method for forming a water-soluble, electrification-suppressing film on an electron beam resist. The method has such an advantage that the water-soluble compounds have no influence upon the resist at the coating and removal.

The above-mentioned prior art of depositing a thin metal film by evaporation has such problems as complicatedness in the deposition by evaporation and contamination by metal elements in case of semiconductor devices.

Furthermore, the prior art disclosed in the above-mentioned Japanese Patent Application Kokai (Laid-Open) No. 63-129622 is not effective for suppressing the electrification when the substrate is coated with a silicon oxide film or the substrate itself has an insulating property.

Moreover, the prior art disclosed in the above-mentioned Japanese Patent Application Kokai (Laid-Open) No. 1-132122 has such a problem as slow charge transfer because the disclosed materials are ion-conducting. Therefore, it is difficult to obtain a sufficient electrification-suppressing effect in the high-speed electron beam writing.

SUMMARY OF THE INVENTION

A first object of the present invention is to provide a method for suppression of electrification with easy coating and removal and high electrification-suppressing effect even in vacuum with less contamination.

A second object of the present invention is to provide a method for suppression of electrification with easy reduction of errors in the pattern width and pattern placement errors due to electrification in the lithography process using electron beam writing and with less contamination.

A third object of the present invention is to provide a method for suppression of electrification with easy prevention of dielectric breakdown of an oxide film on a substrate due to electrification in the ion implantation step and with less contamination.

A fourth object of the present invention is to provide a method for suppression of electrification with easy prevention of image distortion or measurement accuracy reduction due to electrification, which has been a problem in the shape observation and line width measurement using a charged particle beam, and with less contamination.

The first object of the present invention mentioned above can be attained by a method for suppression of electrification which comprises forming a water-soluble and electron-conducting electrification-suppressing film comprising a polymer resin in an area to be irradiated with a charged particle beam such as an electron beam.

The second object of the present invention mentioned above can be attained by carrying out a lithography process based on the electron beam writing after the formation of the electrification-suppressing film on the substrate.

The third object of the present invention mentioned above can be attained by carrying out an ion implantation process after the formation of the electrification-suppressing film on the substrate.

The fourth object of the present invention mentioned above can be attained by carrying out shape observation and line width measurement using a charged particle beam after the formation of the electrification-suppressing film on the substrate.

According to the present method, a conducting polymer is applied to a substrate prior to irradiation with a charged particle beam and, if necessary, is removed by washing with water after the irradiation with the charged particle beam.

As a result of investigation on various materials, it has been found that films comprising a conducting polymer having a monomeric structure unit represented by the following formula (I), (II), (III), (III'), or (III'') can be used as an electrification-suppressing film. The materials per se are disclosed in Japanese Patent Application Kokai (Laid-Open) No. 63-39916.

(I)

wherein Ht represents NH, S or O; R represents R' or OR' in which R' represents a linear or branched divalent hydrocarbon group having 1 to 10 carbon atoms or a divalent hydrocarbon group containing an ether linkage; X represents $SO_3$; Z represents OR'X—H, OR'H, H, or OH in which R' and X have the same meanings as defined above; and n represents a number of 5 or more.

The conducting polymers having the monomeric structural units of formula (I) for use in the present invention include, for example, polymers having such monomer units as thiophene-3-(2-ethanesulfonic acid), butanesulfonic acid), thiophene-3-(5-pentanesulfonic acid), thiophene-3-(6-hexanesulfonic acid), thiophene-3-(7-heptanesulfonic acid), thiophene-3-(2-methyl-3-propanesulfonic acid), thiophene-3-(2-methyl-4-butanesulfonic acid), thenylsulfonic acid, 2-(3-thienyloxy)ethanesulfonic acid, 3-(3-thienyloxy)propanesulfonic acid, 4-(3-thienyloxy)butanesulfonic acid, 2-(3-thenyloxy)ethanesulfonic acid, 3-(3-thenyloxy)propanesulfonic acid, 2-(3-thienylethyloxy)ethanesulfonic acid, 3-(3-thienylethyloxy)propanesulfonic acid, 2-[2-(3-thienyloxy)ethoxy]ethanesulfonic acid, 3-[2-(3-thienyloxy)ethoxy]propanesulfonic acid, furan-3-(2-ethanesulfonic acid), furan-3-(3-propanesulfonic acid), furan-3-(4-butanesulfonic acid), furan-3-(5-pentanesulfonic acid), furan-3-(6-hexanesulfonic acid), pyrrole-3-(2-ethanesulfonic acid), pyrrole-3-(3-propanesulfonic acid), pyrrole-3-(4-butanesulfonic acid), pyrrole-3-(5-pentanesulfonic acid), pyrrole-3-(6-hexanesulfonic acid), etc.

The conducting polymers having the monomeric structural units of formula (II) include, for example, polymers having such monomer units as 2-methoxy-5-(propyloxy-3-sulfonic acid)-1,4-phenylenevinylene, 2-ethoxy-5-(propyloxy-3-sulfonic acid)-1,4-phenylenevinylene, 2-propyloxy-5-(propyloxy-3-sulfonic acid)-1,4-phenylenevinylene, 2-butyloxy-5-(propyloxy-3-sulfonic acid)-1,4-phenylenevinylene, 2,5-bis(propyloxy-3-sulfonic acid)-1,4-phenylenevinylene, 2,5-bis(ethyloxy-2-sulfonic acid)-1,4-phenylenevinylene, 2,5-bis-(butyloxy-4-sulfonic acid)-1,4-phenylenevinylene, 5-(propyloxy-3-sulfonic acid)-1,4-phenylenevinylene, 5-(ethyloxy-2-sulfonic acid)-1,4-phenylenevinylene, 5-(butyloxy-4-sulfonic acid)-1,4-phenylenevinylene, 5-(pentyloxy-4-sulfonic acid)-1,4-phenylenevinylene, etc.

The conducting polymers having the monomeric structural units of formula (III) include, for example, polymers having such monomer units as aniline-3-(2-ethanesulfonic acid), aniline-3-(3-propanesulfonic acid), aniline-3-(4-butanesulfonic acid), aniline-3-(5-pentanesulfonic acid), aniline-3-(6-hexanesulfonic acid), aniline-3-(7-heptanesulfonic acid), aniline-3-(2-methyl-3-propanesulfonic acid), aniline-3-(2-methyl-4-butanesulfonic acid), etc.

The conducting polymers having the monomeric structural units of formula (III') include, for example, polymers having such monomer units as aniline-3-sulfonic acid.

The conducting polymers having the monomeric structural units of formula (III'') include, for example, polymers having such monomer units as aniline-N-(2-ethanesulfonic acid), aniline-N-(3-propanesulfonic acid), aniline-N-(4-butanesulfonic acid), aniline-N-(5-pentanesulfonic acid), aniline-N-(6-hexanesulfonic acid), aniline-N-(7-heptanesulfonic acid), aniline-N-(2-methyl-3-propanesulfonic acid), aniline-N-(2-methyl-4-butanesulfonic acid), etc.

When the conducting polymers are low molecular weight polymers such as those having a degree of polymerization (n) of less than 5 in formula (I), (II), (III), (III'), or (III''), the polymers per se have a low conductivity and a sufficient electrification-suppressing effect is hard to obtain. Therefore, conducting polymers having n of at least 5 should be used.

Furthermore, conducting copolymers having at least 10% by mole, preferably at least 50% by mole of the monomeric structural unit represented by formula (I), (II), (III), (III'), or (III'') and a $\pi$-electron conjugated system along the polymer main chain can be also used in place of the above-mentioned conducting polymers to be applied to the substrate. Any conducting copolymer can be used, so far as it has the same solubility and conductivity as those of the above-mentioned conducting polymers. For example, conducting copolymers having at least 50% by mole of the monomeric structural unit represented by formula (I), the remainder monomeric structural unit being 3-alkylthiophene, can be used.

It is also possible to use conducting polymer composites containing at least 0.1% by weight, preferably at least 10% by weight of the above-mentioned conducting polymer or the above-mentioned conducting copolymer.

These and other objects and many of the attendant advantages of the invention will be readily appreciated as the same becomes better understood by reference to the following detailed description when considered in connection with the accompanying drawings.

DETAILED DESCRIPTION OF THE INVENTION

As a result of extensive studies conducted by the present inventors on characteristics of materials that can attain the above-mentioned objects, it has been found that the objects of the present invention can be attained by materials meeting the following three requirements, i.e. (1) water-solubility, (2) electron conductivity and (3) polymer resin.

Since the above-mentioned conducting polymers are water-soluble and water can be used as a coating solvent, they can be applied to a film of material easily soluble in an organic solvent such as resist, etc. without attacking the film and since the conducting polymers can retain the water solubility even after the electron beam writing at a high (electron beam) exposure dose, they can be easily removed by washing with water. Moreover, because the conductive mechanism is based on the electron conductivity, rapid transfer of charge can be obtained and a sufficient electrification-suppressing effect can be thus obtained even in the high-speed electron beam writing.

Furthermore, the conducting polymers have a unit structure in which anionic groups are covalently bonded to the main chain having $\pi$-electrons through conjugated bonding in advance and the adjacent anionic groups act as dopants in the oxidation of $\pi$-electron conjugated system, so that the conducting polymers can show a stable conductivity. Thus, the conducting polymers can show a high conductivity of $10^{-3}$ to 10 S/cm more stably for a long period of time even in vacuum than the conventional conducting polymers, so that the adverse effect due to the electrification can be considerably reduced in the ion implantation, the image observation by charged particles, and the linewidth measurement as well as in the above-mentioned electron beam writing.

The present invention will be explained below in detail, referring to Examples, which will not limit the scope of the present invention.

The conducting polymers used in these examples have the structure represented by the following formulas (Ia), (Ib), (Ic), (Id), (IIa), (IIIa), (III'a), and (III"a).

The conducting polymer (Ia) is poly[thiophene-3-(3-propanesulfonic acid)], which was prepared according to the process described in "Polymer Preprints Japan" of No. 39 Meeting of Kobunshi Gakkai, Vol. 39, page 561 (1990).

The conducting polymer (Ib) is poly[2-(3-thienylethyloxy)ethanesulfonic acid] which was prepared by reacting commercially available thiophene ethanol with an alcohol protected halide such as chloroethyl tosylate, eliminating the tosyl group from the resulting (3-thienylethyloxy)ethyl tosylate to obtain (3-thienylethyloxy)ethanol, introducing sulfonic acid thereto by a process similar to that described in "Synthetic Metals", Vol. 30, page 305 (1989), and polymerizing the resulting monomer in the same manner as above.

The conducting polymer (Ic) is poly[pyrrole-3-(4-butanesulfonic acid)] which was prepared by synthesizing sodium pyrrole-3-(4-butanesulfonate) according to a process described in "Polymer Bulletin, Berline", Vol. 18, page 277 (1987), then polymerizing the resulting sulfonate according to a process similar to that described in "Journal of American Chemical Society", Vol. 109, page 1858 (1987), and then converting the sodium sulfonate salt to sulfonic acid in the same manner as above.

The conducting polymer (Id) is poly[furan-3-(3-propanesulfonic acid)] which was prepared by a process similar to that described in "Polymer Preprints Japan" of No. 39 Meeting of Kobunshi Gakkai, Vol. 39, page 561 (1990) using commercially available 3-bromofuran as a starting material.

The conducting polymer (IIa) is poly[2-methoxy-5-(propyloxy-3-sulfonic acid)-1,4-phenylenevinylene] which was prepared by a process described in "Proceeding of the ACS Division of Polymeric Materials: Science and Engineering", Vol. 59, page 1164 (1988, Autumn meeting).

The conducting polymer (IIIa) is poly[aniline-2-(3-propanesulfonic acid)] which was prepared according to a process described in Japanese Patent Application Kokai (Laid-Open) No. 63-39916.

The conducting polymer (III'a) is poly(aniline-3-sulfonic acid) which was prepared according to a process described in "Journal of American Chemical Soceity", Vol. 112, page 2800 (1990).

The conducting polymer (III"a) is poly[aniline N-(3-propanesulfonic acid)] which was prepared according to a process described in "Journal of Chemical Soceity Chemical Communication", page 180 (1990).

(Ia) had an average molecular weight $Mw = 1 \times 10^5$ (measured by GPC in terms of pulluran equivalent molecular weight) and a degree of polymerization n of about 490. (Ib) had $Mw = 3 \times 10^4$ (measured in the same manner as above) and n of about 130. (Ic) had $Mw = 5 \times 10^4$ (measured in the same manner as above) and n of about 270. (Id) had $Mw = 2.5 \times 10^4$ (measured in the same manner as above) and n of about 130. (IIa) had $Mw = 1.4 \times 10^5$ (measured in the same manner as above) and n of about 520. (IIIa) had $Mw = 8 \times 10^4$ (measured in the same manner as above) and n of about 380. (III'a) had $Mw = 2 \times 10^4$ (measured in the same manner as above) and n of about 120. (III"a) had $Mw = 4 \times 10^4$ (measured in the same manner as above) and n of about 190.

EXAMPLE 1

In this example, the present method for suppression of electrification was applied to the step of forming a pattern on a tri-level resist using electron beam writing. Explanation will be made below referring to FIGS. 1A-1D.

Figure 1A:
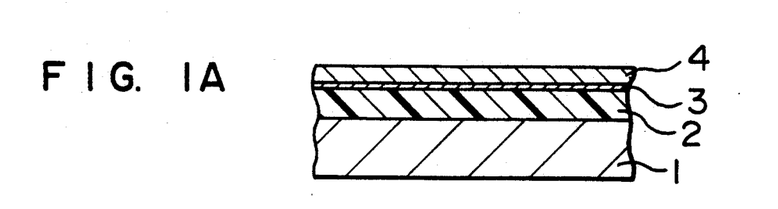
FIGS. 1A, 1B, 1C and 1D are cross-sectional views of semiconductor devices in process flow when the present method for suppression of electrification is applied to a lithography process using electron beam writing in the production of semiconductor devices.

FIG. 1A: A novolak-based photoresist was spin-coated on a silicon substrate 1 and baked at 210° C. for 30 minutes to obtain a resin layer 2 having a thickness of 3.2 μm. Then, a spin-on glass was spin-coated thereon and baked at 200° C. for 30 minutes to obtain an intermediate layer 3 having a thickness of 0.1 μm. Furthermore, an electron beam Resist RD2000N (trade mark of a product made by Hitachi Chemical Co., Ltd., Japan) was spin-coated thereon to obtain an electron beam resist 4 having a thickness of 0.5 μm.

Figure 1B:
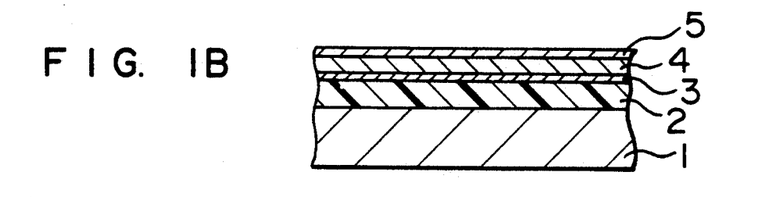

FIG. 1B: An aqueous 1% solution of conducting polymer (Ia) was spin-coated on the resist layer 4 to obtain a conducting polymer layer 5 having a thickness of 0.1 μm and a sheet resistance of about 100 kΩ/□.

Figure 1C:
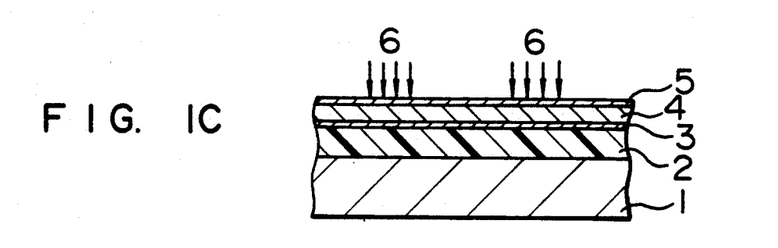

FIG. 1C: Electron beam 6 at an accelerating voltage of 30 kV was selectively irradiated at an irradiation dose of 100 μC/cm$^2$.

Figure 1D:
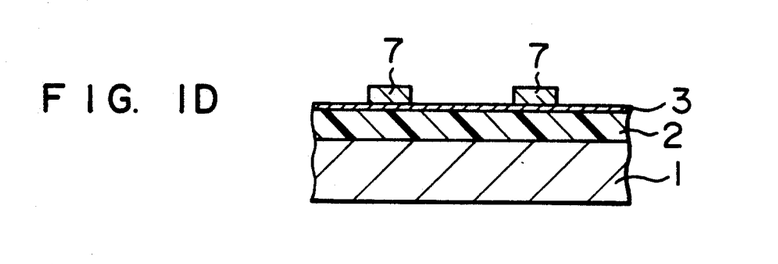

FIG. 1D: After washing with running water for 1 minute, development was carried out with an aqueous 1% solution of tetramethylammonium hydroxide to obtain a resist pattern 7.

Figure 2A:
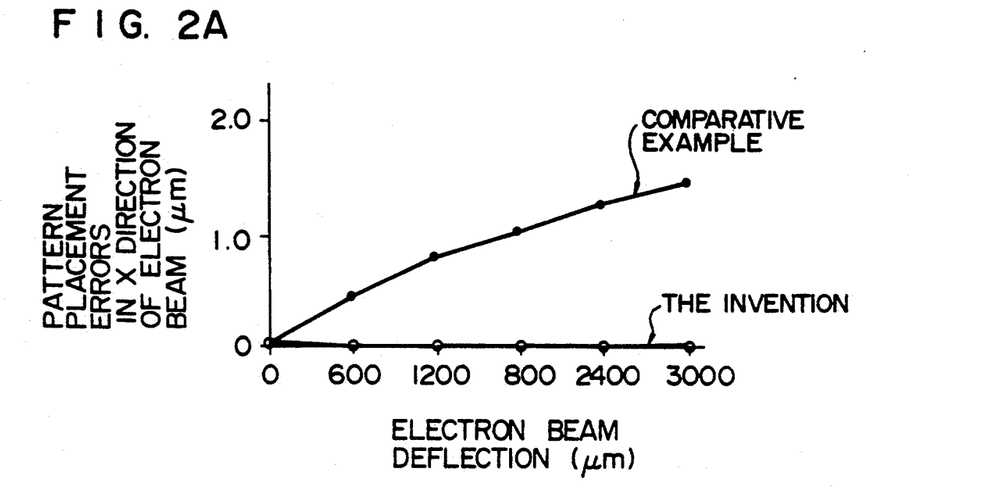
FIGS. 2A and 2B show comparison of placement errors in the pattern formation between the present method for suppression of electrification and a conventional method applied to electron beam writing.
Figure 2B:
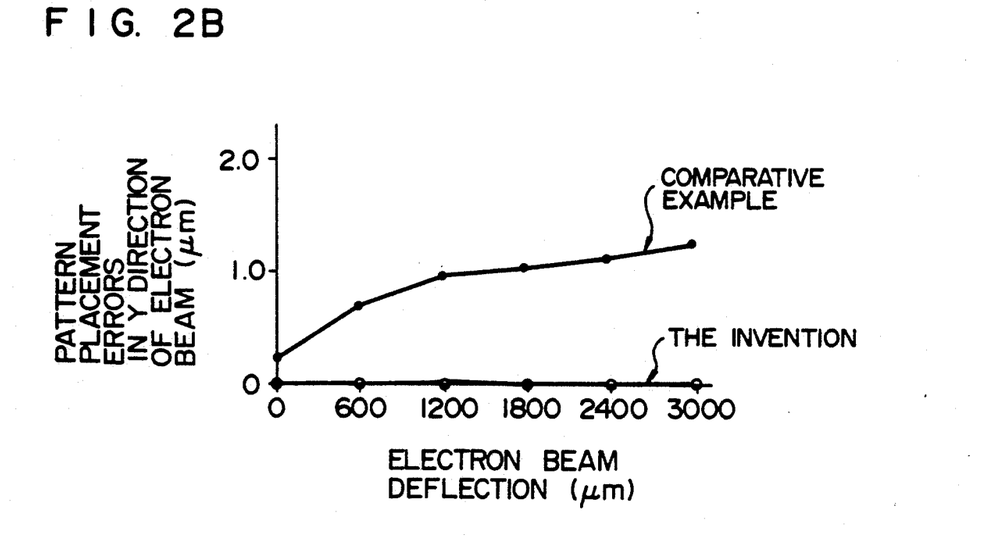

Pattern placement errors within the field of the electron beam deflection (3 mm□) are shown in FIG. 2A and FIG. 2B. A comparative example using none of such conducting polymer, pattern placement errors is also shown in these FIGS. 2A and 2B. FIG. 2A shows pattern placement errors in X direction and FIG. 2B shows those in Y direction. It can be seen from FIGS. 2A and 2B that when none of such conducting layer is used, a pattern placement error of 1.5 μm at maximum appears, while the placement error due to the electrification can be reduced to less than 0.05 μm according to the present method. More generally, materials mainly composed of phenol resin and durable against dry etching can be selected as the photoresist 2 as an underlayer.

EXAMPLE 2

This example shows application of the present method for suppression of electrification to an ion implantation process.

FIGS. 3A-3D are cross-sectional views of devices which show parts of process flow in the production of MOS transistors.

Figure 3A:
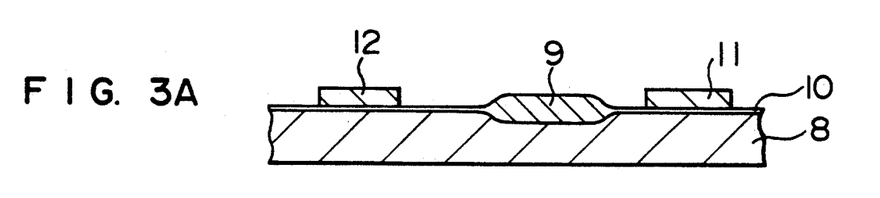
FIGS. 3A, 3B, 3C and 3D are cross-sectional views of semiconductor devices in process flow when the present method for suppression of electrification is applied to an ion implantation process at a high concentration in the production of the semiconductor devices.

FIG. 3A: The devices were isolated from one another with a thick silicon oxide film 9 on a p-type silicon substrate 8 and a gate oxide film 10 was formed on the surface of the silicon substrate. Furthermore, gate electrodes 11 and 12 were formed from poly-silicon.

Figure 3B:
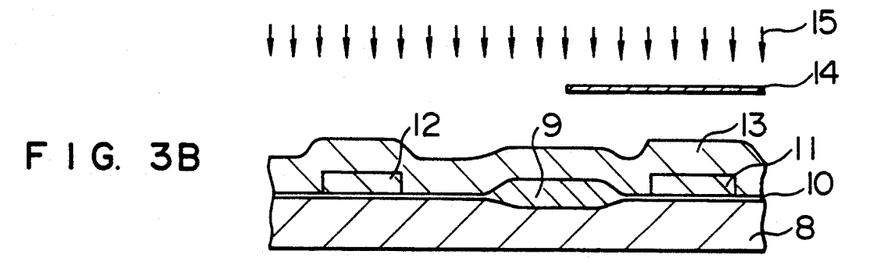

FIG. 3B: Then, a photoresist 13 was spin-coated thereon and ultraviolet rays 15 were exposed thereto through a photomask 14.

Figure 3C:
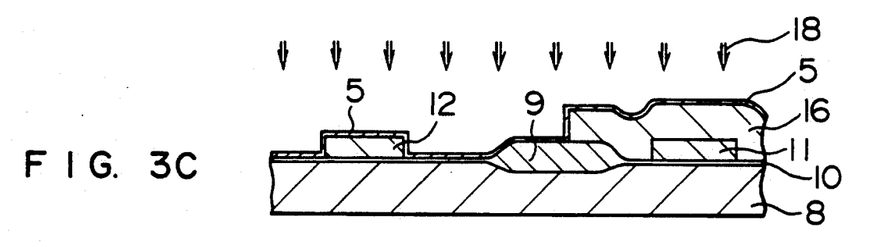

FIG. 3C: Then, development was carried out while leaving a photoresist pattern 16 covering parts of the transistor on one hand and exposing other regions on the other. Thereafter, an aqueous solution of conducting polymer (IIa) was spin-coated thereon to form a conducting polymer layer 5 having a film thickness of 40 nm and a sheet resistance of 250 kΩ/□. Then, implantation of arsenic ion 18 was conducted at an accelerating voltage of 50 KV and a dose of $2 \times 10^{15}$/cm$^2$.

Figure 3D:
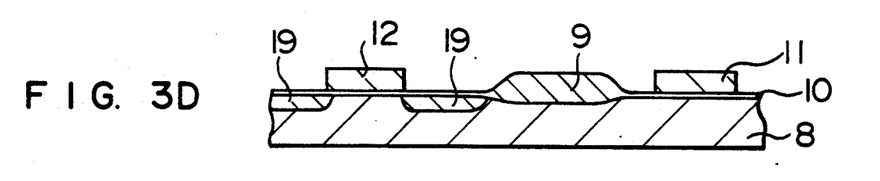

FIG. 3D: Thereafter, the conducting polymer layer 5 and the photoresist pattern 16 were removed by an oxygen plasma, followed by heat treatment to form an n+ layer 19 constituting a source and a drain. Thereafter, wiring of electrodes was carried out in the usual manner to form a device. Without the conducting polymer, some devices had an abnormality in the breakdown voltage of the gate electrodes when the ion implantation dose was more than about $1 \times 10^{13}$/cm$^2$. On the other hand, the transistors of the present invention had no such a poor breakdown voltage.

EXAMPLE 3

MOS type transistors were produced in the same manner as in Example 2 except that conducting polymer (IIIa) was used in place of conducting polymer (IIa) for the conducting polymer layer 5 in FIG. 3C. Film thickness was 50 nm and sheet resistance was 500 kΩ/□. None of the transistors in this example had a poor breakdown voltage.

The similar results were obtained with conducting polymer (III'a) or (III''a) in place of conducting polymer (IIIa).

EXAMPLE 4

This example shows application of the present method of suppression of electrification to fine linewidth measurement with an electron beam. Explanation is made below, referring to FIGS. 4A-4C.

Figure 4A:
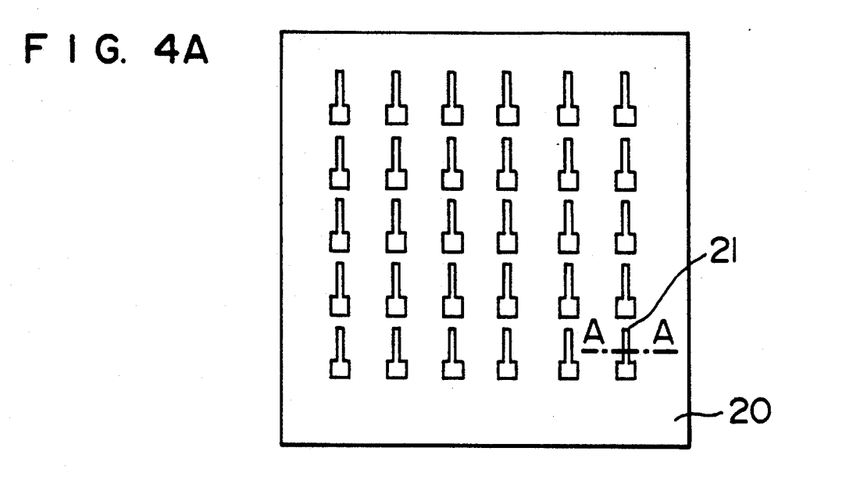
FIG. 4A is a plan view of a sample for line width measurement using an electron beam.
Figure 4B:
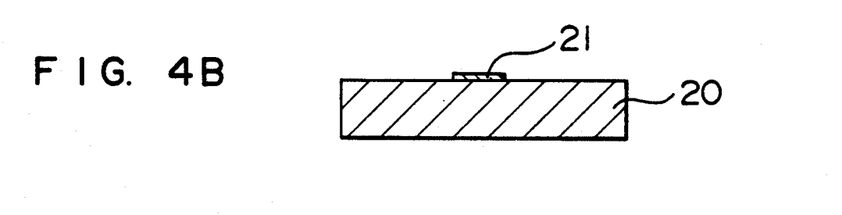
FIGS. 4B and 4C are partial cross-sectional views of a sample along line A—A' in process flow for the production of the sample when the present method for suppression of electrification is applied to linewidth measurement using an electron beam.
Figure 4C:
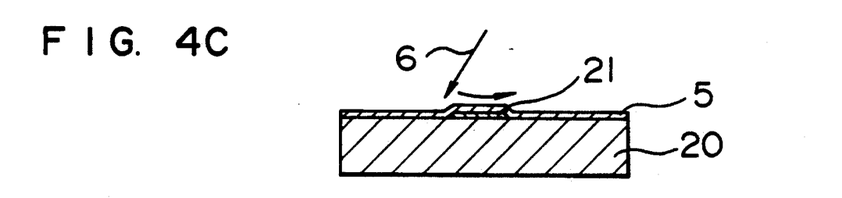

FIG. 4A is a plan view of a photomask having patterns thereon. The photomask comprises a quartz glass substrate 20 and chromium patterns 21 formed thereon. FIG. 4B shows a cross-section of the photomask shown in FIG. 4A along the line A—A'. In the measurement of chromium patterns 21, an aqueous solution of conducting polymer (Ia) was spin-coated onto the mask substrate to form a conducting polymer layer 5 as shown in FIG. 4C and size of the patterns was measured by an electron beam linewidth measurement system. The linewidth was determined from reflected electron and secondary electron signals obtained by scanning an electron beam 6 in the vicinity of the patterns. Since the mask substrate 20 was made of quartz and high in the insulating property, measurement reproducibility was round to be $3\sigma=0.5$ µm without the conducting polymer layer 5, while it was found to $3\sigma=0.03$ µm according to the procedure of this example.

The present method was found highly effective not only for the linewidth measurement, but also for the measurement of placement. Furthermore, in the case of image observation using an electron beam microscope, especially a scanning type electron microscope, observation can be made without any image distortion due to the electrification.

EXAMPLE 5

Figure 5A:
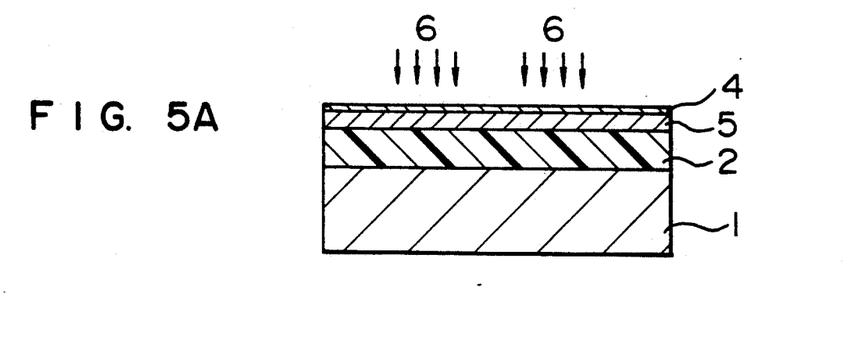
FIG. 5A, 5B and 5C are a cross-sectional view of semiconductor devices in process flow when the present method for suppression of electrification is applied to a lithography process using electron beam writing in the production of the semiconductor devices.
Figure 5B:
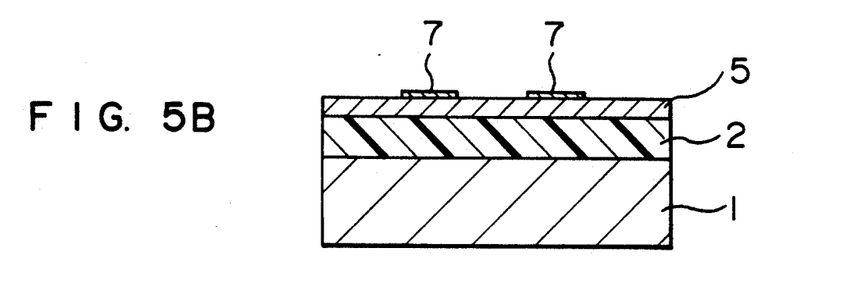
Figure 5C:
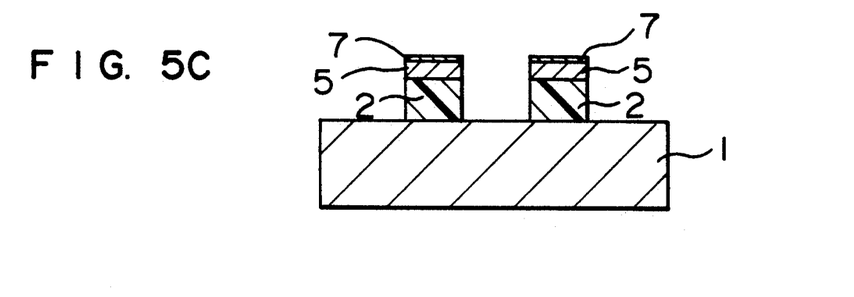

FIGS. 5A-5C show application of the present method for suppression of electrification to a multilayer resist scheme using a silicon-containing electron beam resist.

FIG. 5A: A novolak resin photoresist was spin-coated on a silicon substrate 1 and baked at 210° C. for 30 minutes to obtain a resin layer 2 having a thickness of 3.2 µm. Then, an aqueous 2% solution of conducting copolymer comprising 60% by mole of monomeric structure unit represented by formula (Ia) and 40% by mole of 3-hexylthiophene was spin-coated on the resin layer 2 and baked at 90° C. for 10 minutes to obtain a conducting polymer layer 5 having a thickness of 0.5 µm and a sheet resistance of about 20 k$\Omega$/□. Then, a silicon-containing electron beam resist was spin-coated thereon and baked at 80° C. for 10 minutes to obtain an electron beam resist layer 4 having a thickness of 0.15 µm. Thereafter, selective irradiation with an electron beam 6 at an accelerating voltage 30 KV and a dose of 40 µC/cm² was conducted.

FIG. 5B: A resist pattern 7 was formed by development with an organic solvent for 1 minute.

FIG. 5C: The conducting polymer layer 5 and the resin layer 2 were subjected to etching by reactive ion etching with an oxygen plasma using the resist pattern 7 as a mask. Thereafter, pattern placement error was determined and found to be a pattern placement error of 0.05 µm at maximum and thus no influence by electrification was observed.

EXAMPLE 6

FIGS. 6A-6F show application of the present method for suppression of electrification to the production of a phase-shift reticle. Phase-shift lithography which is now in a keen attention is a process which makes it possible to much improve the resolution limit by shifting the phase of light by 180° between adjacent patterns. Principle and method of production of reticles are described, for example, in Hasegawa et al: "Sub µm lithography" in "Electrochemistry and Industrial Physical Chemistry", Vol. 58, No. 4, pages 330–335. Since a transparent insulating material is used as a shifter material in the process, the process suffers from a new problem of electrification of substrate which has not been any problem in the conventional production of reticles.

Figure 6A:
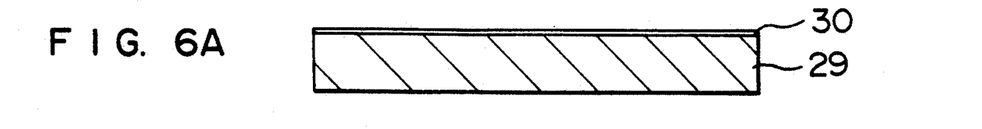
FIG. 6A, 6B, 6C, 6D, 6E and 6F are cross-sectional views of a phase-shift reticle in process flow when the present method for suppression of electrification is applied to the production of the reticles.
Figure 6B:
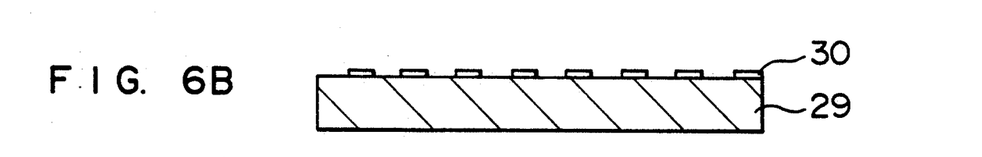
Figure 6C:
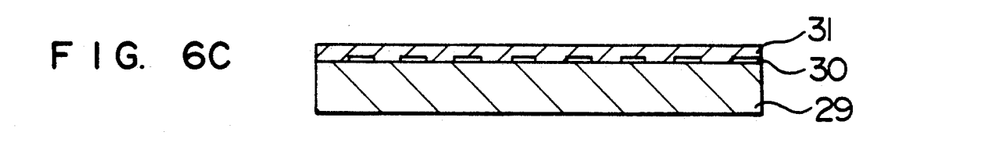
Figure 6D:
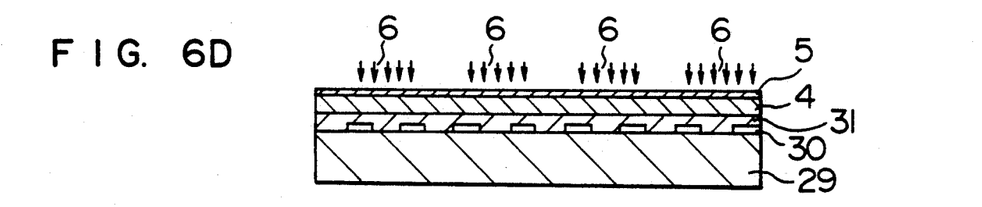
Figure 6E:
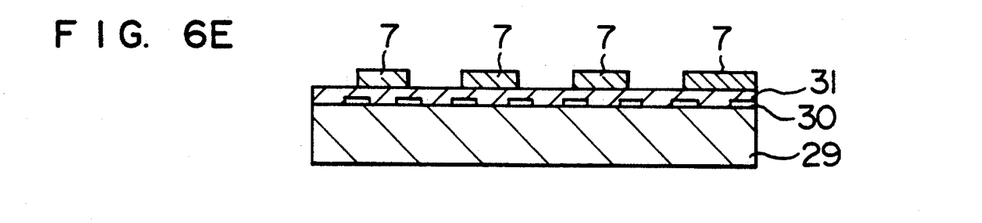
Figure 6F:
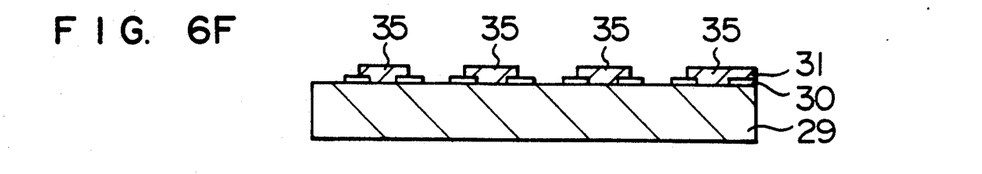

FIG. 6A shows a usual chromium mask substrate, where a metallic chromium layer 30 is deposited on a quartz glass substrate 29, so that no electrification of the substrate occurs. Therefore, the chromium patterns were formed according to the conventional method for the production of reticles to obtain a structure of FIG. 6B. Thereafter, a phase shifter material 31 i.e. a silicon oxide film was deposited on the entire surfaces of the chromium patterns as shown in FIG. 6C. In this structure, the metallic chromium existed as isolated from one another on the quartz substrate, and thus electrification of the substrate occurred upon irradiation with electron beams. Therefore, an electron beam resist layer 4 was formed by coating and, furthermore, an aqueous 1% solution of conducting polymer (Ia) was coated thereon to form a conducting polymer layer 5 as shown in FIG. 6D. Then, electron beams were irradiated to the area in which the shifter was to be retained, and the resist was developed to obtain resist patterns 7 as shown in FIG. 6E. Thereafter, as shown in FIG. 6F, the shifter material 31 was subjected to wet etching, while using the resist patterns 7 as masks, thereby obtaining the desired phase shifter patterns 35. In this example, no pattern placement error due to the electrification occurred even when electron beam writing was carried out on the isolated chromium patterns on the quartz substrate. Furthermore, in the case of the masks formed only from the phase shifter on the quartz substrate, the problem of placement error due to the electrification also did not occur according to the present method.

When (Ib), (Ic) or (Id) was used in place of (Ia) of the conducting polymer layer 5 shown in FIG. 6D, placement error due to electrification also did not occur and nearly the same effect was obtained.

As explained above, various problems such as pattern placement errors, dielectric breakdown, reduction in the measurement accuracy and distortion of observation image due to electrification occurring when the insulating substrate is irradiated with a charged particle beam can be solved according to the present method for suppression of electrification. Furthermore, since the conducting polymers used in the present invention have a water solubility even after irradiation with a charged particle beam, they can be easily removed by washing with water when unwanted. When the above conducting polymers are applied to the production of semiconductor devices, they can have a good conductivity since they are composed mainly of carbon, hydrogen, nitrogen, oxygen, and sulfur as constituting elements and contain none of such alkali metals or heavy metals as to give an adverse effect on silicon semiconductors. Therefore, even if the present method invention is ap- plied in the course of the production of semiconductors, no adverse effect is given to the successive steps and characteristics of resulting semiconductor device.

It is further understood by those skilled in the art that the foregoing description is preferred embodiments of the disclosed device and that various changes and modifications may be made in the invention without departing from the spirit and scope thereof.

What is claimed is:

1. A method for suppression of electrification which comprises a step of forming on a substrate a water-soluble electrification-suppressing film having an electron conductivity and a step of irradiating a charged particle beam on the substrate;

the electrification-suppressing film comprising a conducting polymer having a monomeric structure unit represented by the following formula (I), (II), (III), (III'), OR (III''):

(I)

(II)

(III)

(III')

(III'')

wherein Ht represents NH, S or O; R represents R' or OR' in which R' represents a linear or branched divalent hydrocarbon group having 1 to 10 carbon atoms or a divalent hydrocarbon group containing an ether linkage; X represents SO$_3$; Z represents OR'X—H, OR'H, H or OH in which R' and X have the same meanings as above; and n represents a number of 5 or more.

2. A method according to claim 1, wherein the charged particle beam is an electron beam emitted from an electron beam source of an electron microscope.

3. A method according to claim 1, wherein the charged particle beam is an electron beam emitted from an electron source of an electron beam writing device.

4. A method according to claim 1, wherein the charged particle beam is an ion beam emitted from an ion source of an ion implantation device.

5. A method according to claim 1, wherein the charged particle beam is an electron beam emitted from an electron beam source of a linewidth measurement device.

6. A method for suppression of electrification which comprises a step of forming a first layer on a substrate, a step of forming on the first layer an electrification-suppressing film having an electron conductivity a step of forming a resist layer on the electrification-suppressing layer, and a step of irradiating a charged particle beam onto the substrate;

said electrification-suppressing film comprising a conducting polymer having a monomeric structure unit represented by the following formula (I), (II), (III), (III'), OR (III''):

(I)

(II)

(III)

(III')

(III'')

wherein Ht represents NH, S or O; R represents R' or OR' in which R' represents a linear or branched divalent hydrocarbon group having 1 to 10 carbon atoms or a divalent hydrocarbon group containing an ether linkage; X represents SO$_3$; Z represents OR'X—H, OR'H, H or OH in which R' and X have the same meanings as above; and n represents a number of 5 or more.

7. A method for suppression of electrification which comprises a step of forming a first layer on a substrate, a step of forming on the first layer a second layer different from the first layer in etching characteristics, a step of forming a resist layer on the second layer, a step of forming on the resist layer an electrification-suppressing film having an electron conductivity, and a step of irradiating a charged particle beam onto the substrate;

said electrification-suppressing film comprising a conducting polymer having a monomeric structure unit represented by the following formula (I), (II), (III), (III'), OR (III''):

wherein Ht represents NH, S or O; R represents R' or OR' in which R' represents a linear or branched divalent hydrocarbon group having 1 to 10 carbon atoms or a divalent hydrocarbon group containing an ether linkage; X represents $SO_3$; Z represents OR'X—H, OR'H, H or OH in which R' and X have the same meanings as above; and n represents a number of 5 or more.

8. A method according to claim 7, wherein the first layer comprises a novolak-based resist.

9. A method according to claim 7, wherein the second layer comprises a spin-on glass.

10. A method according to claim 7, wherein the charged particle beam is an electron beam.

11. A method for suppression of electrification which comprises a step of forming an insulating film on a substrate, a step of forming on the insulating film a resist layer having a given shaft, a step of forming on the substrate an electrification-suppressing film having an electron conductivity, and a step of irradiating a charged particle beam onto the substrate;

said electrification-suppressing film comprising a conducting polymer having a monomeric structure unit represented by the following formula (I), (II), (III), (III'), OR (III''):

wherein Ht represents NH, S or O; R represents R' or OR' in which R' represents a linear or branched divalent hydrocarbon group having 1 to 10 carbon atoms or a divalent hydrocarbon group containing an ether linkage; X represents $SO_3$; Z represents OR'X—H, OR'H, H or OH in which R' and X have the same meanings as above; and n represents a number of 5 or more.

12. A method according to claim 11, wherein the charged particle beam is an ion beam.

13. A method according to claim 12, wherein the ion beam is at a dose of at least $10^{13}/cm^2$.

14. A method for suppression of electrification which comprises a step of forming a first layer having a given shape on an insulating substrate, a step of forming on the substrate an electrification-suppressing film having an electron conductivity, and a step of irradiating a charged particle beam onto the substrate;

said electrification-suppressing film comprising a conducting polymer having a monomeric structure unit represented by the following formula (I), (II), (III), (III'), OR (III''):

-continued wherein Ht represents NH, S or O, R represents R' or OR' in which R' represents a linear or branched divalent hydrocarbon group having 1 to 10 carbon atoms or a divalent hydrocarbon group containing an ether linkage; X represents $SO_3$; Z represents OR'X—H, OR'H, H or OH in which R' and X have the same meanings as above; and n represents a number of 5 or more.

15. A method according to claim 14, wherein the first layer comprises a metal.

16. A method according to claim 14, wherein the charged particle beam is an electron beam.

17. A method for suppression of electrification which comprises the step of forming a first layer having a given shape on an insulating substrate, a step forming a phase shift layer on the first layer, a step of forming a resist layer on the phase shift layer, a step of forming on the resist layer an electrification-suppressing film having an electron conductivity, a step of forming a resist layer on the electrification-suppressing layer, and a step of irradiating a charged particle beam onto the substrate;

said electrification-suppressing film comprising a conducting polymer having a monomeric structure unit represented by the following formula (I), (II), (III), (III'), OR (III''):

wherein Ht represents NH, S or O; R represents R' or OR' in which R' represents a linear or branched divalent hydrocarbon group having 1 to 10 carbon atoms or a divalent hydrocarbon group containing an ether linkage; X represents $SO_3$; Z represents OR'X—H, OR'H, H or OH in which R' and X have the same meanings as above; and n represents a number of 5 or more.

18. A method according to claim 17, wherein the phase shifting layer comprises a silicon oxide film.

19. A method according to claim 17, wherein the first layer comprises a metal.

* * * * *